(12) United States Patent
Lopelli et al.

(10) Patent No.: US 10,644,926 B1
(45) Date of Patent: May 5, 2020

(54) HYBRID POLAR MODULATOR

(71) Applicant: QUALCOMM Incorporated, San Diego, CA (US)

(72) Inventors: Emanuele Lopelli, Laguna Nigel, CA (US); Magnus Olov Wiklund, San Jose, CA (US); Salvatore Pennisi, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/394,884

(22) Filed: Apr. 25, 2019

(51) Int. Cl.
| | |
|---|---|
| *H04L 27/36* | (2006.01) |
| *H04L 27/20* | (2006.01) |
| *G06T 1/20* | (2006.01) |
| *H04W 72/04* | (2009.01) |
| *H03L 7/08* | (2006.01) |

(52) U.S. Cl.
CPC ............... *H04L 27/36* (2013.01); *G06T 1/20* (2013.01); *H03L 7/08* (2013.01); *H04L 27/2003* (2013.01); *H04W 72/04* (2013.01)

(58) Field of Classification Search
CPC ....................................................... H04L 27/36
USPC ......................................................... 375/302
See application file for complete search history.

(56) References Cited

U.S. PATENT DOCUMENTS

| | | | | |
|---|---|---|---|---|
| 2008/0064343 | A1* | 3/2008 | Lewis | H03C 5/00 455/91 |
| 2015/0195119 | A1* | 7/2015 | Song | H04L 27/2614 375/302 |
| 2018/0076903 | A1* | 3/2018 | Oyama | H04B 10/6165 |

* cited by examiner

*Primary Examiner* — Lihong Yu
(74) *Attorney, Agent, or Firm* — Holland & Hart LLP/Qualcomm

(57) ABSTRACT

Methods, systems, and devices for wireless communications are described. The method may include identifying phase information generated from modulation information, mapping the phase information by mapping a second phase point located in a second quadrant to a first phase point of a first quadrant, where the first phase point may be associated with a phase trajectory of the phase information, synthesizing the mapped phase information associated with the phase trajectory based on mapping the phase information, rotating the phase trajectory based on a phase-plane rotation value associated with mapping the phase information, and generating a modulated signal associated with a carrier frequency based on mapping the phase information and rotating the phase trajectory.

16 Claims, 12 Drawing Sheets

HYBRID POLAR MODULATOR

BACKGROUND

The following relates generally to wireless communications, and more specifically to a hybrid polar modulator.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM).

A wireless multiple-access communications system may include a number of base stations or network access nodes, each simultaneously supporting communication for multiple communication devices, which may be otherwise known as user equipment (UE). Such devices in communications networks may benefit from improved polar modulation techniques.

SUMMARY

The described techniques relate to improved methods, systems, devices, and apparatuses that support a hybrid polar modulator, such as a hybrid wideband polar modulator, and related operations. Generally, the described techniques provide for improved polar modulation techniques that avoid zero-crossings without increasing the required modulator bandwidth. The present techniques combine, in some examples, a frequency modulator and a phase-plane rotator to achieve zero-crossing avoidance without impacting the phase trajectory or requiring large oversampling rates. The present techniques may include synthesizing a phase trajectory associated with a phase signal, mapping phase points of the phase trajectory from a first quadrant to a second quadrant, rotating at least a portion of the phase trajectory in the second quadrant, or any combination thereof. The present techniques result in reduced oversampling without the cost of increased spectral regrowth, which results in reduced power consumption and reduced modulator bandwidth compared to other zero-crossing avoidance techniques.

A method of image processing at a device is described. The method may include identifying phase information generated from modulation information, mapping the phase information by mapping a second phase point located in a second quadrant to a first phase point of a first quadrant, the first phase point being associated with a phase trajectory of the phase information, synthesizing the mapped phase information associated with the phase trajectory based on mapping the phase information, rotating the phase trajectory based on a phase-plane rotation value associated with mapping the phase information, and generating a modulated signal associated with a carrier frequency based on mapping the phase information and rotating the phase trajectory.

An apparatus for image processing at a device is described. The apparatus may include a processor, memory in electronic communication with the processor, and instructions stored in the memory. The instructions may be executable by the processor to cause the apparatus to identify phase information generated from modulation information, map the phase information by mapping a second phase point located in a second quadrant to a first phase point of a first quadrant, the first phase point being associated with a phase trajectory of the phase information, synthesize the mapped phase information associated with the phase trajectory based on mapping the phase information, rotate the phase trajectory based on a phase-plane rotation value associated with mapping the phase information, and generate a modulated signal associated with a carrier frequency based on mapping the phase information and rotating the phase trajectory.

Another apparatus for image processing at a device is described. The apparatus may include means for identifying phase information generated from modulation information, mapping the phase information by mapping a second phase point located in a second quadrant to a first phase point of a first quadrant, the first phase point being associated with a phase trajectory of the phase information, synthesizing the mapped phase information associated with the phase trajectory based on mapping the phase information, rotating the phase trajectory based on a phase-plane rotation value associated with mapping the phase information, and generating a modulated signal associated with a carrier frequency based on mapping the phase information and rotating the phase trajectory.

A non-transitory computer-readable medium storing code for image processing at a device is described. The code may include instructions executable by a processor to identify phase information generated from modulation information, map the phase information by mapping a second phase point located in a second quadrant to a first phase point of a first quadrant, the first phase point being associated with a phase trajectory of the phase information, synthesize the mapped phase information associated with the phase trajectory based on mapping the phase information, rotate the phase trajectory based on a phase-plane rotation value associated with mapping the phase information, and generate a modulated signal associated with a carrier frequency based on mapping the phase information and rotating the phase trajectory.

Some examples of the method, apparatuses, and non-transitory computer-readable medium described herein may further include operations, features, means, or instructions for determining a mapping correspondence by determining that the second phase point may be located in the second quadrant, or a third quadrant, or a fourth quadrant, where mapping the phase information may be based on the mapping correspondence.

Some examples of the method, apparatuses, and non-transitory computer-readable medium described herein may further include operations, features, means, or instructions for rotating the phase trajectory may be based on determining that the second phase point may be located in the second quadrant, or the third quadrant, or the fourth quadrant.

In some examples of the method, apparatuses, and non-transitory computer-readable medium described herein, rotating the phase trajectory further may include operations, features, means, or instructions for rotating the phase trajectory: positive 90 degrees when the second phase point may be located in the second quadrant, 180 degrees when the second phase point may be located in the third quadrant, or negative 90 degrees when the second phase point may be located in the fourth quadrant.

In some examples of the method, apparatuses, and non-transitory computer-readable medium described herein, synthesizing the phase information further may include operations, features, means, or instructions for calculating, before rotating the phase trajectory, a derivative of the mapped phase information to generate frequency information to enable a phase locked loop to modulate the frequency information.

In some examples of the method, apparatuses, and non-transitory computer-readable medium described herein, synthesizing the phase information further may include operations, features, means, or instructions for modulating, before rotating the phase trajectory, the frequency information to generate a modulated phase information to enable a phase-plane rotator to rotate the modulated phase information.

In some examples of the method, apparatuses, and non-transitory computer-readable medium described herein, rotating the phase trajectory may include operations, features, means, or instructions for communicating the modulated phase information through an analog delay line and a multiplexor to modify the modulated phase information, and providing the modified modulated phase information to a power amplifier.

Some examples of the method, apparatuses, and non-transitory computer-readable medium described herein may further include operations, features, means, or instructions for generating amplitude information and the phase information based on performing a Coordinate Rotation Digital Computer (CORDIC) algorithm on the modulation information.

In some examples of the method, apparatuses, and non-transitory computer-readable medium described herein, generating the modulated signal may include operations, features, means, or instructions for combining the modulated phase information with the amplitude information in a power amplifier after rotating the phase trajectory.

DETAILED DESCRIPTION

Zero-crossings in polar modulations create signal bandwidth expansion. This expansion requires a frequency modulator (like a phase locked loop (PLL)) to have a very large bandwidth which is often unfeasible or very expensive. Other techniques for zero-crossing avoidance allow for reducing the modulator bandwidth at the cost of sampling rates and therefore higher power consumption, and degraded adjacent channel power ratio (ACPR) due to spectral regrowth coming from a suboptimal trajectory. The present techniques use a communications scheme that combines a frequency modulator and a phase-plane rotator, along with related operations, to achieve zero-crossing avoidance without impacting the phase trajectory or requiring large oversampling rates.

Aspects of the disclosure are initially described in the context of a wireless communications system. Aspects of the disclosure are further illustrated by and described with reference to system diagrams and constellation diagrams. Aspects of the disclosure are further illustrated by and described with reference to apparatus diagrams, system diagrams, and flowcharts that relate to a hybrid polar modulator.

Figure 1:
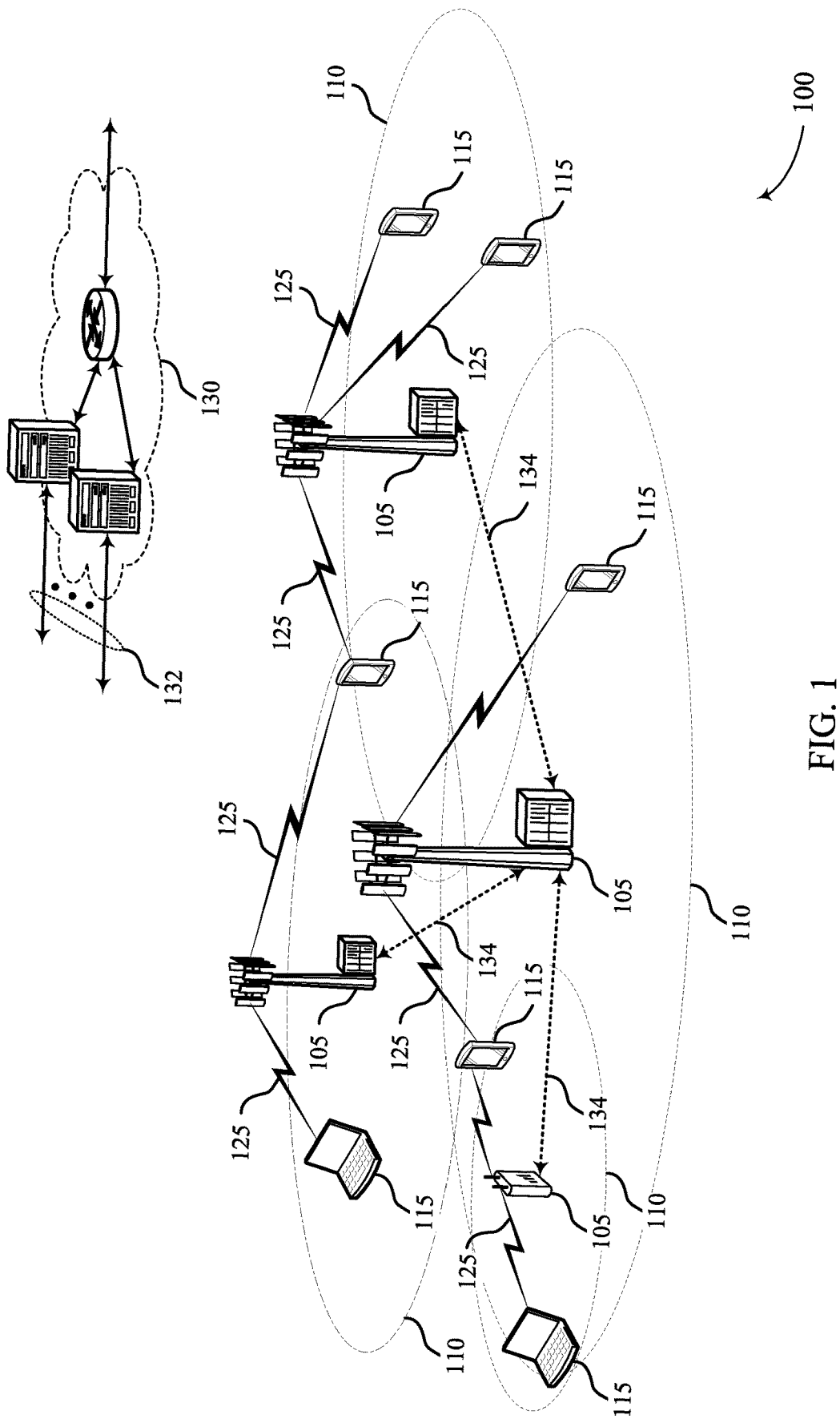
FIG. 1 illustrates an example of a system for wireless communications that supports a hybrid polar modulator in accordance with aspects of the present disclosure.

FIG. 1 illustrates an example of a wireless communications system 100 that supports a hybrid polar modulator in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RB s) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

One or more of the base stations 105 or UEs 115, or both, may include a communications manager, which may implement a scheme that combines a frequency modulator and a phase-plane rotator to achieve zero-crossing avoidance without impacting the phase trajectory or requiring large oversampling rates. In some examples, a communications manager of base stations 105 or UEs 115 may include a frequency modulator combined with a phase-plane rotator that are configured to enable zero-crossing avoidance without impacting a phase trajectory or requiring large oversampling rates. In some examples, the communications manager of base stations 105 or UEs 115 may be configured to synthesize a phase trajectory associated with a phase signal. In some examples, the communications manager of base stations 105 or UEs 115 may be configured to map one or more phase points from the phase trajectory located in a first quadrant to one or more phase points in a second quadrant. In some examples, the communications manager of base stations 105 or UEs 115 may be configured to rotate at least a portion of the phase trajectory mapped to the second quadrant based at least in part on phase-plane rotation values associated with the mapping of the phase points.

Figure 2:
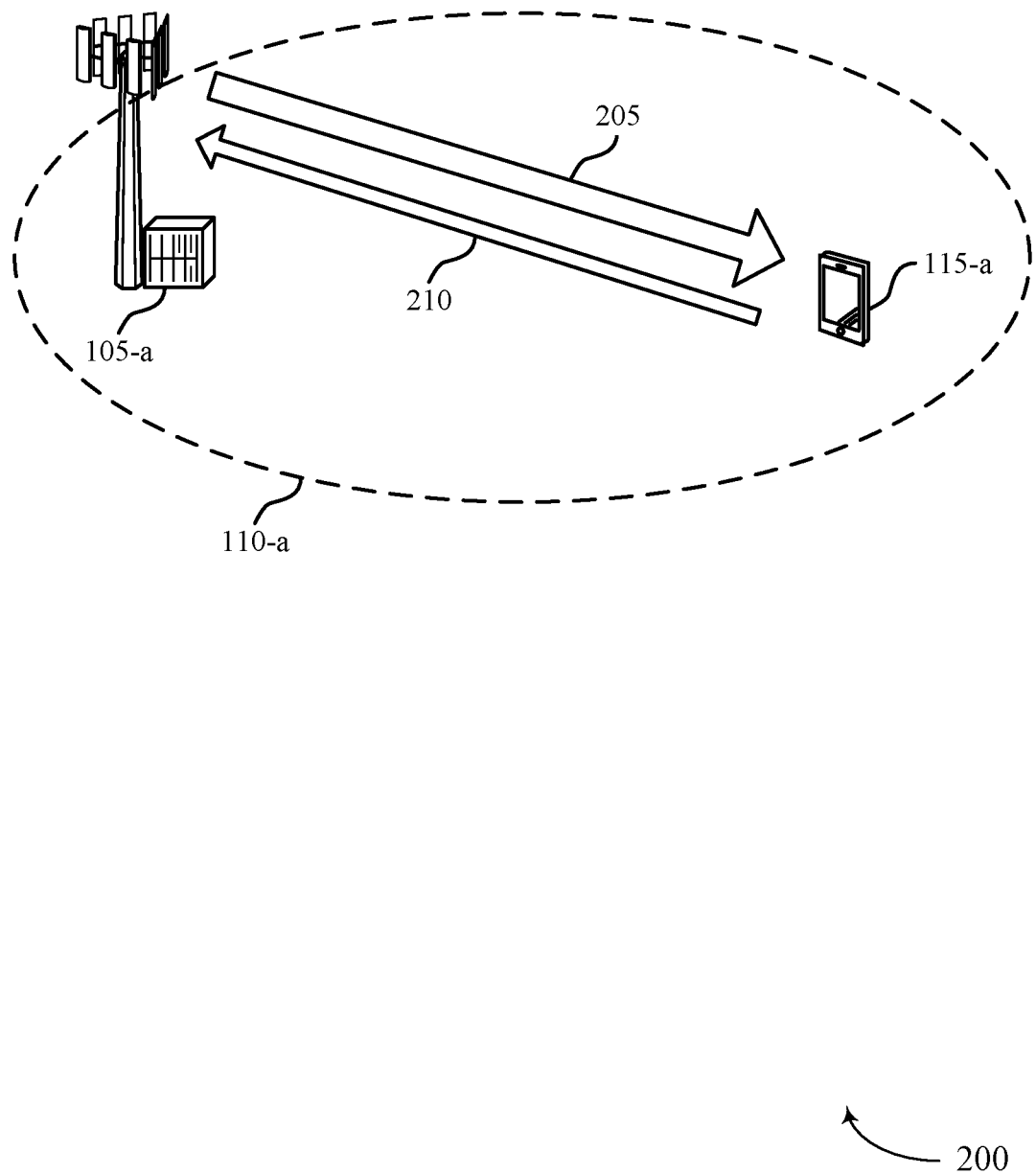
FIG. 2 illustrates an example of a wireless communications system that supports a hybrid polar modulator in accordance with aspects of the present disclosure.

FIG. 2 illustrates an example of a wireless communications subsystem 200 that supports a hybrid polar modulator in accordance with aspects of the present disclosure. In some examples, wireless communications subsystem 200 may implement aspects of wireless communications system 100.

As illustrated, wireless communications subsystem 200 may include UE 115-a and base station 105-a, which may be examples of a UE 115 or a base station 105, as described above with reference to FIG. 1. Wireless communications subsystem 200 may also include downlink 205 and uplink 210. Base station 105-a may use downlink 205 to convey control and/or data information to UE 115-a. And UE 115-a may use uplink 210 to convey control and/or data information to base station 105-a. In some cases, downlink 205 may use different time and/or frequency resources than uplink 210.

In some cases, the data communications of wireless communications subsystem 200 may include polar modulation or quadrature modulation. For example, UE 115-a and base station 105-a may communicate with each other using polar modulation such as quadrature amplitude modulation (QAM) (e.g., 16-QAM, 64-QAM, 256-QAM).

In some examples, UE 115 or base station 105 may generate modulated signals that are based on binary data values that map to points in the quarter-quadrants of a QAM constellation diagram, where each point has a unique phase and amplitude. In some cases, UE 115 or base station 105 may be configured to avoid zero-crossings in polar modulations. In some examples, UE 115 or base station 105 may include a frequency modulator and a phase-plane rotator (which may be combined in some cases) to achieve zero-crossing avoidance without impacting a phase trajectory or requiring large oversampling rates. For example, UE 115-a and base station 105-a may each include a modem that combines a frequency modulator (e.g., phase locked loop (PLL)) with a phase-plane rotator to enable the zero-crossing avoidance for polar modulations.

In some examples, UE 115-a or base station 105-a may be configured to synthesize a subset, such as a quarter-quadrant, in conjunction with the frequency modulator of the modem. In some cases, synthesizing the subset may include calculating a derivative of mapped phase information to generate frequency information. In some cases, generating the frequency information based on calculating the derivative of the mapped phase information may enable a phase locked loop to modulate the frequency information. In some cases, the derivative of the mapped phase information may be calculated before rotating an associated phase trajectory. In some cases, synthesizing the phase information may include modulating the frequency information to generate a modulated phase information to enable a phase-plane rotator to rotate the modulated phase information. In some cases, the modulating frequency information may be modulated before rotating the associated phase trajectory.

In some cases, UE 115 or base station 105 may perform a transition that includes moving or rotating one or more points from a first subset, such as a first quarter-quadrant, to a second subset, such as a second quarter quadrant. In some cases, the frequency modulator (e.g., PLL) of UE 115 or base station 105 may perform at least a portion of the transition. In some cases, UE 115 or base station 105 may rotate a subset, such as a quarter-quadrant, of the constellation map. For example, UE 115 or base station 105 may rotate a quarter-quadrant in a positive direction (e.g., +90 degrees, +180 degrees) or a negative direction (e.g., −90 degrees, −180 degrees). In some cases, a phase-plane rotator of UE 115 or base station 105 may perform the quarter-quadrant constellation rotation. In some cases, a quarter-quadrant mapper of UE 115 or base station 105 may remap a constellation point in a first quadrant to a constellation point in a second quadrant of the constellation diagram. In some examples, UE 115 or base station 105 may each include a modem. In some cases, the modem may include at least a frequency modulator (e.g., phase locked loop (PLL)), a phase-plane rotator, and/or a quarter-quadrant mapper.

Figure 3:
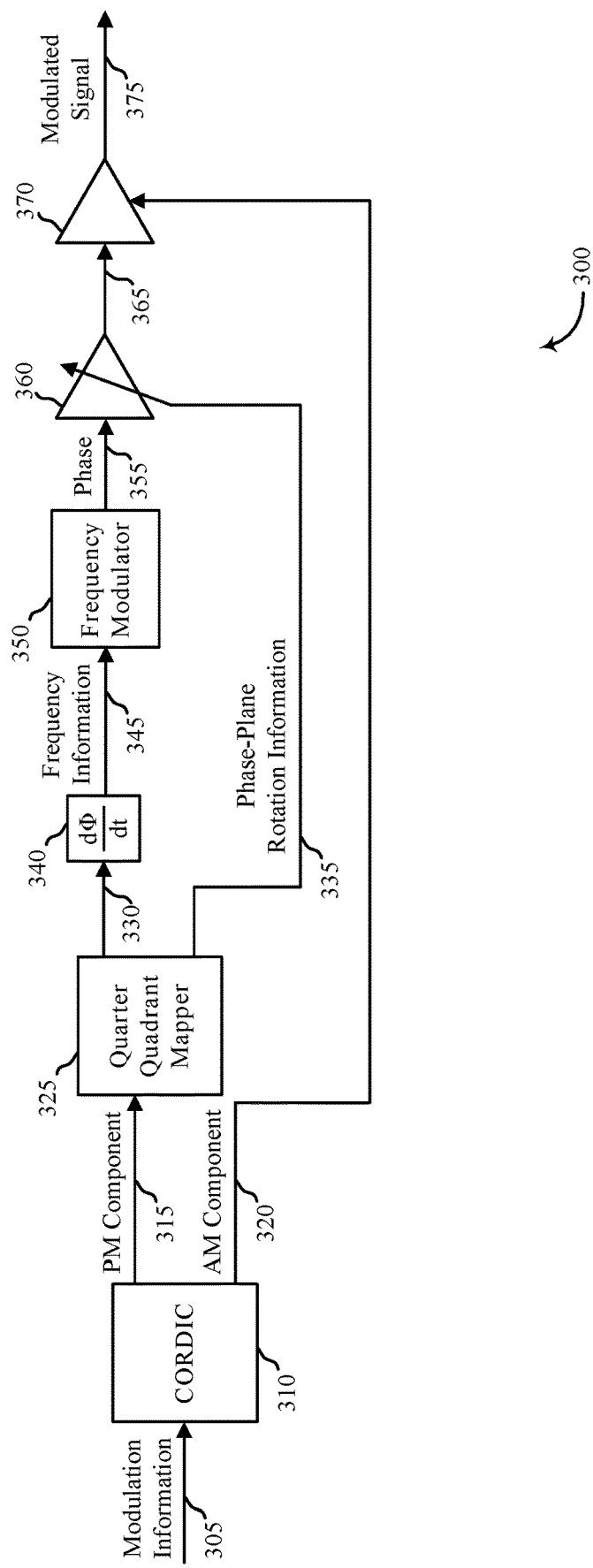
FIG. 3 illustrates an example of a wireless communications system that supports a hybrid polar modulator in accordance with aspects of the present disclosure.

The present techniques implemented in UE 115-a and base station 105-a result in zero-crossings being avoided without increasing the required modulator bandwidth. The constellation transitioning of the present techniques result in reduced oversampling without the cost of increased spectral regrowth, which results in reduced power consumption compared to other zero-crossing avoidance techniques FIG. 3 illustrates an example of a wireless communications system 300 that supports a hybrid polar modulator in accordance with aspects of the present disclosure. In some examples, wireless communications system 300 may implement aspects of wireless communications system 100. Wireless communications system 300 may be an example of at least a portion of a modem in a communication device (e.g., base station 105 or UE 115 from FIG. 1 or FIG. 2). In some examples, wireless communications system 300 may include various components. In one example, wireless communications system 300 may include a Coordinate Rotation Digital Computer (CORDIC) unit 310, or a quarter quadrant mapper 325, or a derivative unit 340, or a frequency modulator 350, or a phase plane rotator 360, or a power amplifier 370, or any combination thereof. In some cases, CORDIC unit 310 may implement one or more operations (e.g., Volder's algorithm) to calculate functions, such as hyperbolic and/or trigonometric functions, associated with the present techniques.

In one example, wireless communications system 300 may perform one or more operations on modulation information 305. In some examples, CORDIC unit 310 may generate (e.g., via a CORDIC algorithm) a phase modulation (PM) component 315 and an amplitude modulation (AM) component 320 from the modulation information 305. In some cases, CORDIC unit 310 may provide PM component 315 to quarter quadrant mapper 325 and provide AM component 320 to power amplifier 370. In other cases, a different flow of information may be implemented.

In some examples, the wireless communications system 300 may include an analog portion and a digital portion. In some cases, the analog portion may operate on (e.g., receive, interpolate, modify, analyze, generate) analog signals, while the digital portion may operate on (e.g., receive, interpolate, modify analyze, generate) digital signals. In some cases, the analog portion may include frequency modulator 350 and phase plane rotator 360. In some cases, the phase-plane rotator 360 may be implemented single-ended as shown, or as a differential. In some cases, the digital portion may include CORDIC unit 310, quarter quadrant mapper 325, derivative unit 340.

In some examples, quarter quadrant mapper 325 may perform one or more operations based at least in part on PM component 315. In some cases, quarter quadrant mapper 325 may perform one or more operations to avoid zero-crossings during symbol transition, as zero-crossings in an in-phase and quadrature (I-Q) plane expand the required modulator bandwidth. In some cases, the one or more operations may include at least one of synthesizing a phase trajectory associated with a phase signal, mapping phase points of the phase trajectory from a first quadrant to a second quadrant, rotating at least a portion of the phase trajectory in the second quadrant, or any combination thereof.

In some cases, quarter quadrant mapper 325 may generate one or more signals. In some cases, at least one signal generated by quarter quadrant mapper 325 may be based at least in part on PM component 315. In one example, quarter quadrant mapper 325 may generate two signals, where a first of the two signals gets sent to a frequency modulator (e.g., frequency modulator 350 via derivative unit 340) and where a second of the two signals controls a phase-plane rotator (e.g., phase plane rotator 360). For example, quarter quadrant mapper 325 may generate at least phase information 330 or may generate at least rotation information 335. In some cases, quarter quadrant mapper 325 may generate at least phase information 330 and rotation information 335.

In some cases, quarter quadrant mapper 325 may provide phase information 330 to a frequency modulator (e.g., frequency modulator 350). In one example, quarter quadrant mapper 325 may provide phase information 330 to derivative unit 340.

In some examples, quarter quadrant mapper 325 may provide rotation information 335 to phase plane rotator 360. In some cases, rotation information 335 may include phase plane rotation information. In some cases, rotation information 335 may include control information. In some examples, phase plane rotator 360 may perform one or more operations based at least in part on rotation information 335. In one example, phase plane rotator 360 may rotate one or more phase points of a phase trajectory based at least on part on rotation information 335. In some cases, rotation information 335 may be based on information in a mapper table. An example of the mapper table for 16-QAM is shown below.

| MAPPER TABLE | | | | | | |
|---|---|---|---|---|---|---|
| Symbol Mapping | | | | Phase-Plane Rotation | | |
| A | B | C | D | B | C | D |
| 1011 | 1100 | 0001 | 0110 | +90° | 180° | −90° |
| 1010 | 1000 | 0000 | 0010 | +90° | 180° | −90° |
| 1111 | 1101 | 0101 | 0111 | +90° | 180° | −90° |
| 1110 | 1001 | 0100 | 0011 | +90° | 180° | −90° |

The exemplary mapper table shows sixteen binary values that chart to 16-QAM phase points for a given quadrant (e.g., each given quadrant) in a 16-QAM constellation diagram. In the exemplary mapper table, quadrant A includes four phase points for binary values 1011, 1010, 1111, and 1110; quadrant B includes four phase points for binary values 1100, 1000, 1101, and 1001. The exemplary mapper table also includes phase-plane rotation values for quadrants B, C, and D. As shown, one advantage of the present techniques is that the worst case phase shift is reduced to π/2 (e.g., a maximum adjustment needed for phase-plane rotation is 180 degrees).

In one example, a phase point outside quadrant A may be mapped to a phase point inside quadrant A. In this example, a phase point in quadrant A may remain in quadrant A (e.g., phase points in quadrant are not mapped or rotated, but remain unaltered in quadrant A). In one example, a phase point in quadrant B, C, or D may be mapped to a phase point in quadrant A. In some cases, a phase trajectory that includes one or more phase points may be rotated according to the phase-plane rotation values shown in the exemplary mapper table. In some examples, the phase-plane rotation information 335 may be based on the phase-plane rotation values shown in the mapper table, which may be received by or stored in one or more devices (e.g., such as a UE or a base station).

In one example, a binary value of 1010 in a data sequence may relate to a phase and amplitude of the second phase point in quadrant A. Based on the present techniques, the second phase point in quadrant A (1010) remains unaltered at the second phase point in quadrant A. In another example, a binary value of 1101 in a data sequence may relate to a phase and amplitude of the third phase point in quadrant B. Based on the present techniques, the third phase point in quadrant B (1101) is mapped to the third phase point in quadrant A (1111). Additionally, the third phase point in quadrant B is rotated positive 90° based on the corresponding phase-plane rotation value in the mapper table for the third phase point in quadrant B. As another example, a binary value of 0011 in a data sequence may relate to a phase and amplitude of the fourth phase point in quadrant D. Based on the present techniques, the third phase point in quadrant D (0011) is mapped to the fourth phase point in quadrant A (1110). Additionally, the fourth phase point in quadrant D is rotated negative 90° based on the corresponding phase-plane rotation value in the mapper table for the fourth phase point in quadrant D.

In some examples, derivative unit 340 may generate frequency information 345. In some cases, generating the frequency information 345 may include derivative unit 340 computing a derivative of phase information 330, where frequency may be the time derivative of phase, and phase may be the time integral of frequency. In some cases, derivative unit 340 may provide frequency information 345 to frequency modulator 350.

In some examples, frequency modulator 350 may perform one or more operations based at least in part on frequency information 345. In some cases, frequency modulator 350 may include a phase locked loop (PLL). In some cases, frequency modulator 350 may generate phase signal 355. In one example, frequency modulator 350 may generate phase signal 355 based at least in part on frequency information 345. In some cases, frequency information 345 may be based on a derivative of the phase information 330 received by derivative unit 340. In some cases, phase signal 355 may be based on an integral of frequency information 345 received by frequency modulator 350. In some cases, the integral of frequency information 345 may be based on the PLL of frequency modulator 350. As indicated above, frequency is the time derivative of phase, and phase is the time integral of frequency. Accordingly, frequency modulator 350 may perform an integral on the frequency information 345 to perform a phase shift through an integration operation.

In some examples, phase plane rotator 360 may perform one or more operations based at least in part on phase signal 355 and phase-plane rotation information 335. In some cases, phase-plane rotation information 335 may be based on phase-plane rotation values, such as the examples shown in the mapper table above. For example, quarter quadrant mapper 325 may generate plane rotation information 335 based on the phase-plane rotation values shown in the mapper table. In one example, quarter quadrant mapper 325 may query the mapper table to identify a corresponding phase-plane rotation value and generate the plane rotation information 335 based on the query. In some cases, phase plane rotator 360 may generate rotated phase signal 365 based at least in part on phase signal 355 and phase-plane rotation information 335.

In some examples, power amplifier 370 may receive rotated phase signal 365 from phase plane rotator 360 and the AM component 320 from CORDIC 310. In some cases, power amplifier 370 may amplify at least a portion of rotated phase signal 365 or AM component 320, or both. In some cases, power amplifier 370 may recreate a modulated signal 375 around a carrier frequency based at least in part on rotated phase signal 365 and AM component 320.

Figure 4:
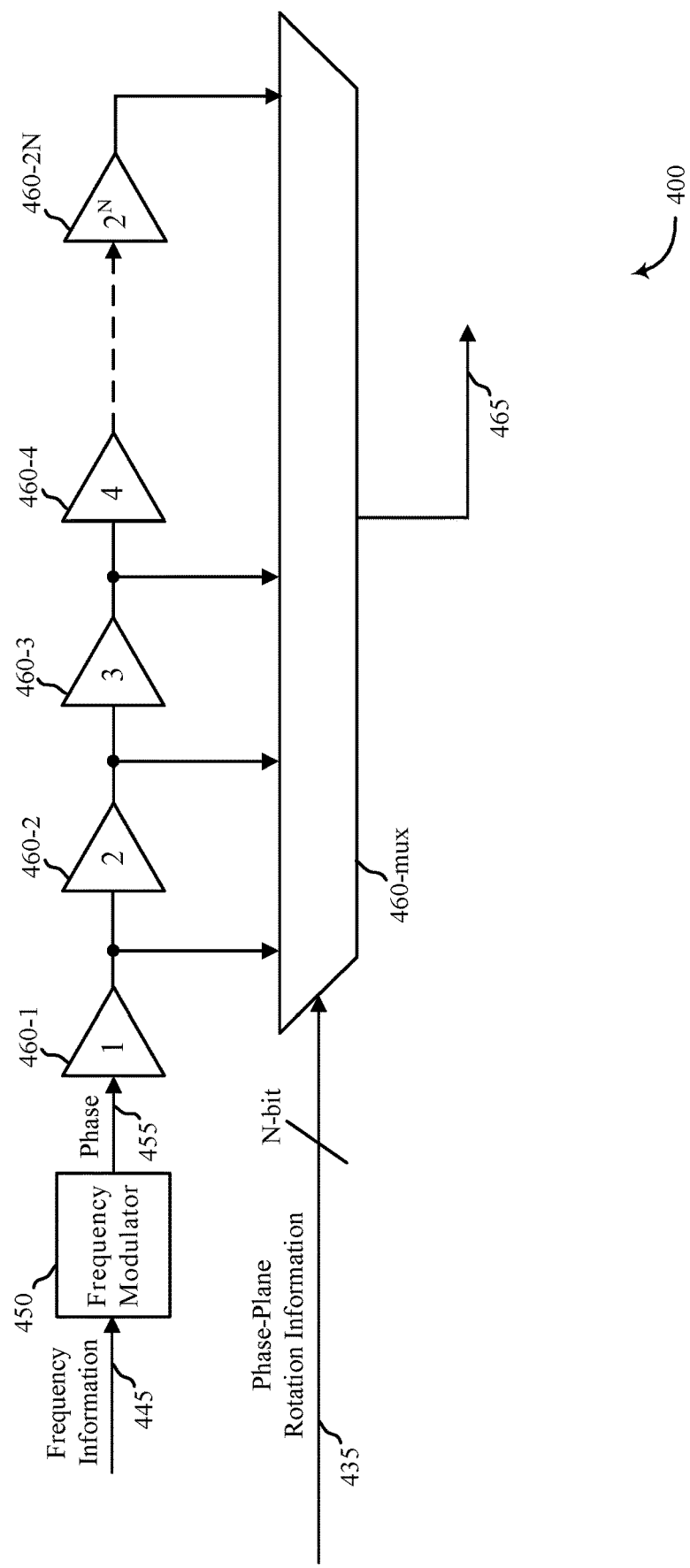
FIG. 4 illustrates an example of a wireless communications system that supports a hybrid polar modulator in accordance with aspects of the present disclosure.

FIG. 4 illustrates an example of a wireless communications system 400 that supports a hybrid polar modulator in accordance with aspects of the present disclosure. In some examples, wireless communications system 400 may implement aspects of wireless communications system 100.

Wireless communications system 400 may be an example of at least a portion of a modem in a communication device (e.g., base station 105 or UE 115 from FIG. 1 or FIG. 2). In some examples, wireless communications system 400 may include various examples of certain components from wireless communications system 300 of FIG. 3. As shown, wireless communications system 400 may include frequency modulator 450 and a phase plane rotator (e.g., phase plane rotator 360) implemented as a delay line (e.g., delay 460-1 to delay 460-2N) and multiplexor 460-mux. In some examples, multiplexor 460-mux may include a smoother interpolating function to adjust a transition associated with phase plane rotator 360.

In the illustrated example, frequency modulator 450 may generate phase signal 455 based at least in part on received frequency information 445. The phase signal 455 may then be sent over (e.g., pass through) the delay line of 460-1 to delay 460-2N. In some cases, multiplexor 460-mux may receive phase-plane rotation information 435. As shown, phase-plane rotation information 435 may include a signal with N-bits. As one example, phase-plane rotation information 435 may include a 4-bit signal (N=4). With phase-plane rotation information 435 as a 4-bit signal, the delay line may start with delay 460-1 and end with delay 460-4, for four delays in all. In the N=4 example, phase signal 455 may pass through delay 460-1, delay 460-2, delay 460-3, and delay 460-4. However, multiplexor may select which of the delays to receive the delayed signal from based on the phase-plane rotation information 435. Accordingly, phase signal 455 may be phase rotated based on the selected delay and multiplexor 460-mux may output the rotated phase signal 465. In some cases, the rotated phase signal 465 may be based at least in part on phase signal (e.g. phase signal 355) and phase-plane rotation information (e.g., phase-plane rotation information 335).

In some examples, a power amplifier (e.g., power amplifier 370) may receive rotated phase signal 465 and an AM component (e.g., AM component 320). In some cases, the power amplifier may amplify at least a portion of rotated phase signal 465 or the AM component, or both. In some cases, the power amplifier may recreate a modulated signal (e.g., modulated signal 375) around a carrier frequency based at least in part on rotated phase signal 465 and the AM component.

Figure 5:
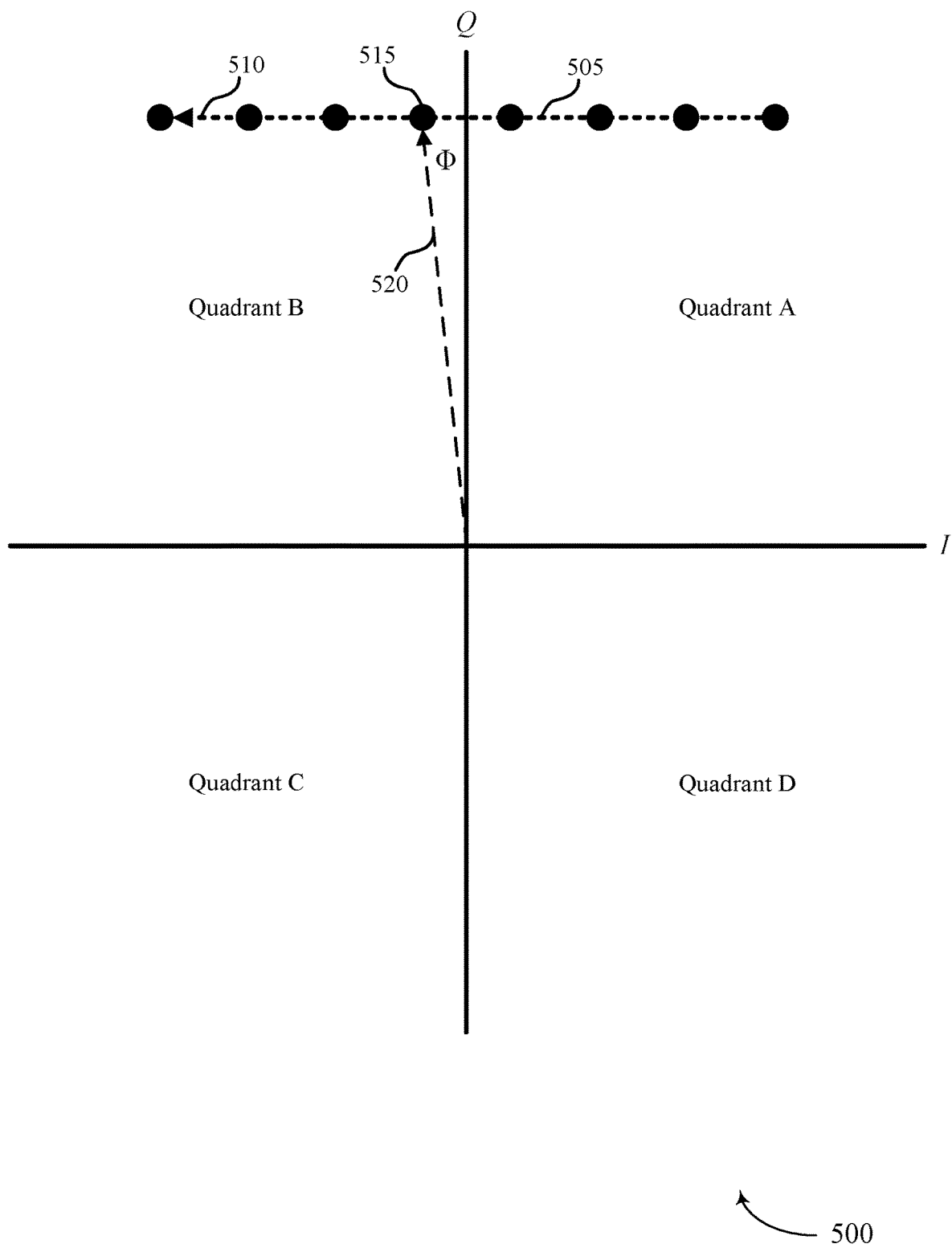
FIG. 5 illustrates an example of a constellation diagram that supports a hybrid polar modulator in accordance with aspects of the present disclosure.

FIG. 5 illustrates an example of a constellation diagram 500 that supports a hybrid polar modulator in accordance with aspects of the present disclosure. In some examples, constellation diagram 500 may implement aspects of wireless communications system 100.

The illustrated constellation diagram 500 may be an example of an in-phase and quadrature (I-Q) plane of a QAM constellation diagram. As shown, the constellation diagram 500 may include a first portion 505 of a phase trajectory in quadrant A and a second portion 510 of the phase trajectory in quadrant B. As shown, the second portion 510 may include a phase point 515. Phase point 515 may include amplitude and phase 520. Based on the present techniques, the second portion 510 of the phase trajectory may be transitioned from the second quadrant to the first quadrant, while the first portion 505 remains in the first quadrant.

The exemplary operations illustrated in the constellation diagram 500 of FIG. 5 may be based at least in part on a device (e.g., base station or UE) combining a frequency modulator and a phase-plane rotator to perform the operations associated with transitioning the second portion 510 of the phase trajectory from the second quadrant to the first quadrant. The operations associated with FIG. 5 may include synthesizing at least the second portion 510 of the phase trajectory, mapping one or more phase points of second portion 510 of the phase trajectory from quadrant B to quadrant A, rotating at least a portion of second portion 510 of the phase trajectory in quadrant A, or any combination thereof. The operations associated with FIG. 5 may result in zero-crossing avoidance without impacting the phase trajectory or requiring large oversampling rates. In some cases, the operations associated with FIG. 5 may result in reduced oversampling without the cost of increased spectral regrowth, which results in reduced power consumption and reduced modulator bandwidth compared to other zero-crossing avoidance techniques.

In some cases, zero-crossings in the I-Q plane may expand the required modulator bandwidth. In one example, a given system may have a signal bandwidth of 20 MHz with 8× oversampling, giving a sampling frequency ($f_s$) of 160 MHz. In some cases, with an origin crossing there may be a π phase shift over one sampling period. In some cases, the required modulator bandwidth (Δf) may be based on a phase angle Ø associated with a phase trajectory (e.g., phase 520). In some cases, the required modulator bandwidth (Δf) may be determined based on a change in phase angle Ø over time (e.g., ΔØ/ΔT). In some cases, the required modulator frequency (e.g., instantaneous required modulator frequency) may represent a modulator frequency deviation to result in a certain phase difference ΔØ. As one example, with a max phase shift of 180°, the required modulator bandwidth (Δf) may be determined by the following equation:

$$\Delta f = \Delta \emptyset / \Delta T = \pi \cdot f_s \approx 500 \text{ MHz}$$

In some cases, it may be relatively difficult for a PLL alone to provide with a required modulator bandwidth equal to or equal approximately to 500 MHz. In some cases, going around the origin may reduce the required modulator bandwidth, but at the cost of larger oversampling (i.e., increased power consumption) and increased spectral regrowth.

Figure 6:
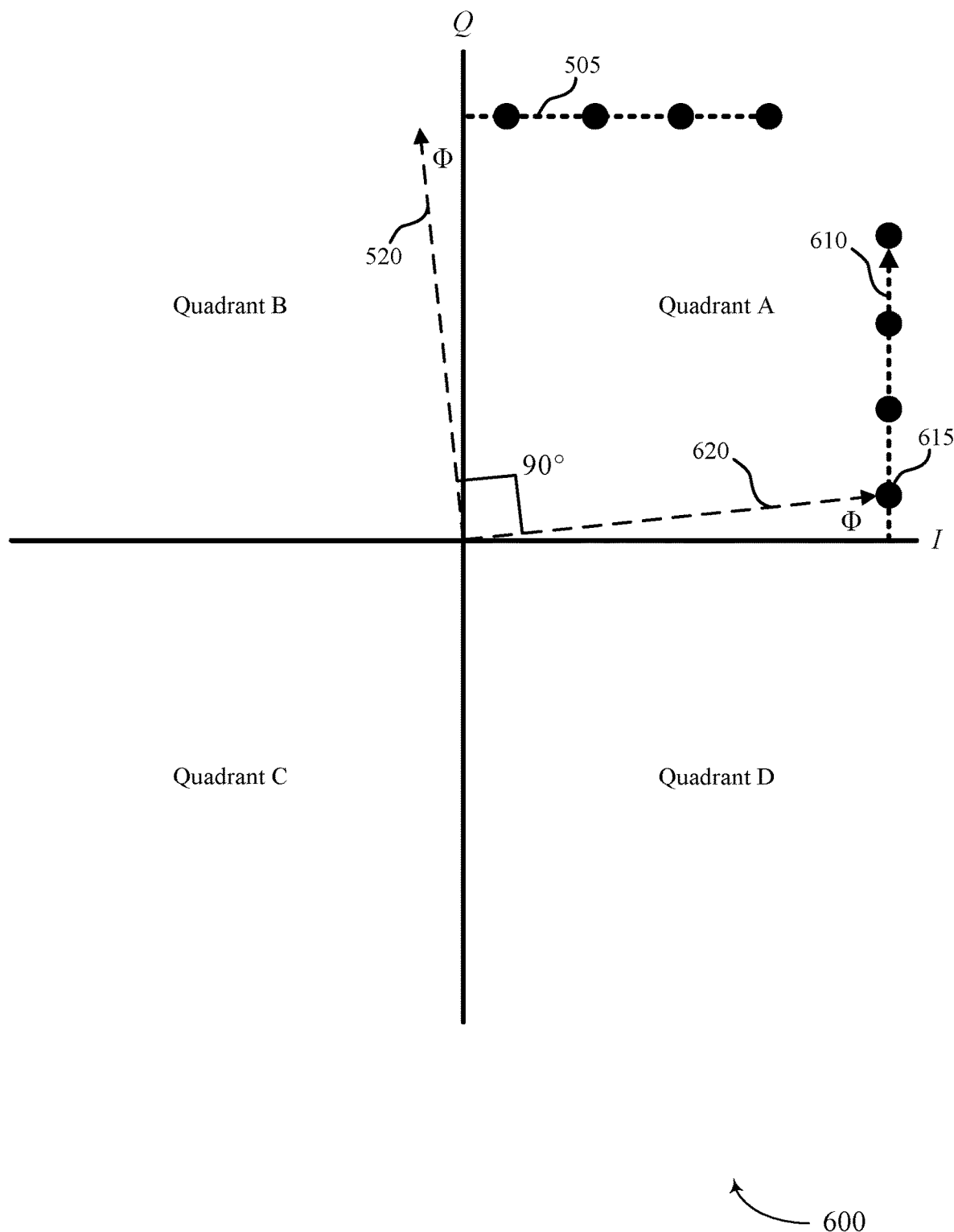
FIG. 6 illustrates an example of a constellation diagram that supports a hybrid polar modulator in accordance with aspects of the present disclosure.

FIG. 6 illustrates an example of a constellation diagram 600 that supports a hybrid polar modulator in accordance with aspects of the present disclosure. In some examples, constellation diagram 600 may implement aspects of wireless communications system 100.

The illustrated constellation diagram 600 may be an example of an I-Q plane of a QAM constellation diagram. Constellation diagram 600 may be an example of constellation diagram 500 of FIG. 5. As shown, constellation diagram 600 may include the first portion 505 of the phase trajectory in quadrant A from FIG. 5. However, the second portion 510 of the phase trajectory that was in quadrant B in FIG. 5 may be transitioned/mapped to quadrant A as second portion 610. As shown, phase point 515 with amplitude and phase 520 in quadrant B from FIG. 5 may be mapped to phase point 615 in quadrant A in FIG. 6. Phase point 615 may be mapped and rotated to include amplitude and phase 620. As shown, amplitude and phase 620 may be based on a rotation, such as a 90 degree rotation, which rotation may be based on phase-plane rotation values in the mapper table provided above (e.g., "+90°" phase-plane rotation for a value in quadrant B transitioned to quadrant A). In a similar fashion, phase points in one or more other quadrants, such as quadrant C and quadrant D, may be mapped and rotated to phase points in a different quadrant, such as quadrant A.

In some cases, the illustrated mapping and rotating of FIG. 6 result in zero-crossings avoidance without increasing the required modulator bandwidth. The illustrated constellation transitioning reduces the required modulator bandwidth without the cost of larger oversampling (i.e., increased power consumption) and without increasing spectral regrowth, enabling a PLL alone to provide the required modulator bandwidth.

Although certain examples describe phase points in quadrants B, C, and D being mapped and rotated into quadrant A, in some examples phase points outside of quadrant B may be mapped to phase points in quadrant B, or phase points outside quadrant C may be mapped to phase points in quadrant C, or phase points outside quadrant D may be mapped to phase points in quadrant D.

In the example where phase trajectories are transitioned into quadrant A, there may be certain phase trajectories that cross into quadrants B, C, or D (e.g., the second portion 510 of the phase trajectory crossing into quadrant B as shown in FIG. 5) where the required modulator bandwidth (e.g., $\Delta f = (\Delta\emptyset)/\Delta T = \pi \cdot f_s$) may be smaller in the original trajectory than in the remapped one. For example, in some cases the required modulator bandwidth for the second portion 510 of the phase trajectory in quadrant B may be smaller than the required modulator bandwidth for the second portion 610 of the phase trajectory that is transitioned to quadrant A as shown in FIG. 6.

In some examples, a wireless communications system (wireless communications system 100 or 300) may determine and analyze the required modulator bandwidth for the original trajectory (the second portion 510 of the phase trajectory in quadrant B) and the required modulator bandwidth of the transitioned trajectory (the second portion 610 of the phase trajectory that is transitioned to quadrant A), and determine based on the analysis to transition and remap the points of the original trajectory that crosses into quadrant B, C, or D when the required modulator bandwidth of the transitioned trajectory is less than the required modulator bandwidth for the original trajectory. In some cases, the digital portion of the wireless communications system (e.g., at least one of CORDIC unit 310, quarter quadrant mapper 325, or derivative unit 340, or any combination thereof) may perform the analysis and make the determinations regarding whether to transition and remap the points of the phase trajectory.

Figure 7:
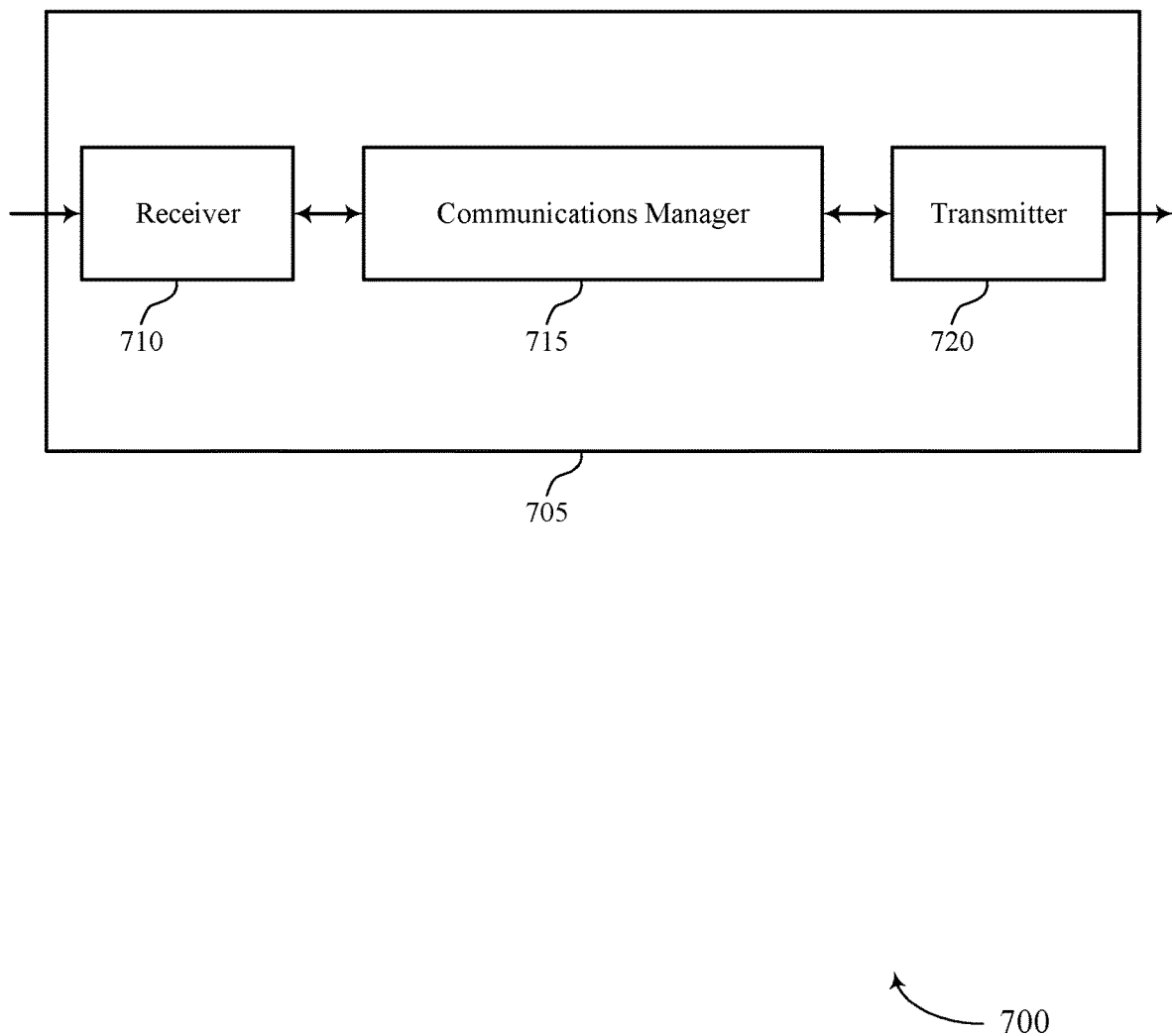
FIGS. 7 and 8 show block diagrams of devices that support a hybrid polar modulator in accordance with aspects of the present disclosure.

FIG. 7 shows a block diagram 700 of a device 705 that supports a hybrid polar modulator in accordance with aspects of the present disclosure. The device 705 may be an example of aspects of a device as described herein. The device 705 may include a receiver 710, a communications manager 715, and a transmitter 720. The device 705 may also include a processor. Each of these components may be in communication with one another (e.g., via one or more buses).

The receiver 710 may receive information such as packets, user data, or control information associated with various information channels (e.g., control channels, data channels, and information related to a hybrid polar modulator). Information may be passed on to other components of the device 705. The receiver 710 may be an example of aspects of the transceiver 1020 described with reference to FIG. 10. The receiver 710 may utilize a single antenna or a set of antennas.

The communications manager 715 may identify phase information generated from modulation information, generate a modulated signal associated with a carrier frequency based on mapping the phase information and rotating the phase trajectory, map the phase information by mapping a second phase point located in a second quadrant to a first phase point of a first quadrant, the first phase point being associated with a phase trajectory of the phase information, synthesize the mapped phase information associated with the phase trajectory based on mapping the phase information, and rotate the phase trajectory based on a phase-plane rotation value associated with mapping the phase information. The communications manager 715 may be an example of aspects of the communications manager 1010 described herein.

The communications manager 715, or its sub-components, may be implemented in hardware, code (e.g., software or firmware) executed by a processor, or any combination thereof. If implemented in code executed by a processor, the functions of the communications manager 715, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The communications manager 715, or its sub-components, may be physically located at various positions, including being distributed such that portions of functions are implemented at different physical locations by one or more physical components. In some examples, the communications manager 715, or its sub-components, may be a separate and distinct component in accordance with various aspects of the present disclosure. In some examples, the communications manager 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1020 described with reference to FIG. 10. The transmitter 720 may utilize a single antenna or a set of antennas.

In some cases, device 705 may include means for identifying phase information generated from modulation information, mapping the phase information by mapping a second phase point located in a second quadrant to a first phase point of a first quadrant, the first phase point being associated with a phase trajectory of the phase information, synthesizing the mapped phase information associated with the phase trajectory based on mapping the phase information, rotating the phase trajectory based on a phase-plane rotation value associated with mapping the phase information, and generating a modulated signal associated with a carrier frequency based on mapping the phase information and rotating the phase trajectory. Examples of the means for these operations, and others described herein, may include, but are not limited to, device 705, receiver 710, communications manager 715, transmitter 720, one or more hardware components of communications manager 715 (e.g., one or more processors of device 705, receiver 710, communications manager 715 or transmitter 720; one or more memory devices of device 705, receiver 710, communications manager 715 or transmitter 720; one or more storage devices of device 705, receiver 710, communications manager 715 or transmitter 720, etc.), one or more computer code components of communications manager 715 (e.g., software applications, software code, or computer processes executable by a processor of device 705, receiver 710, communications manager 715 or transmitter 720, etc.).

Figure 8:
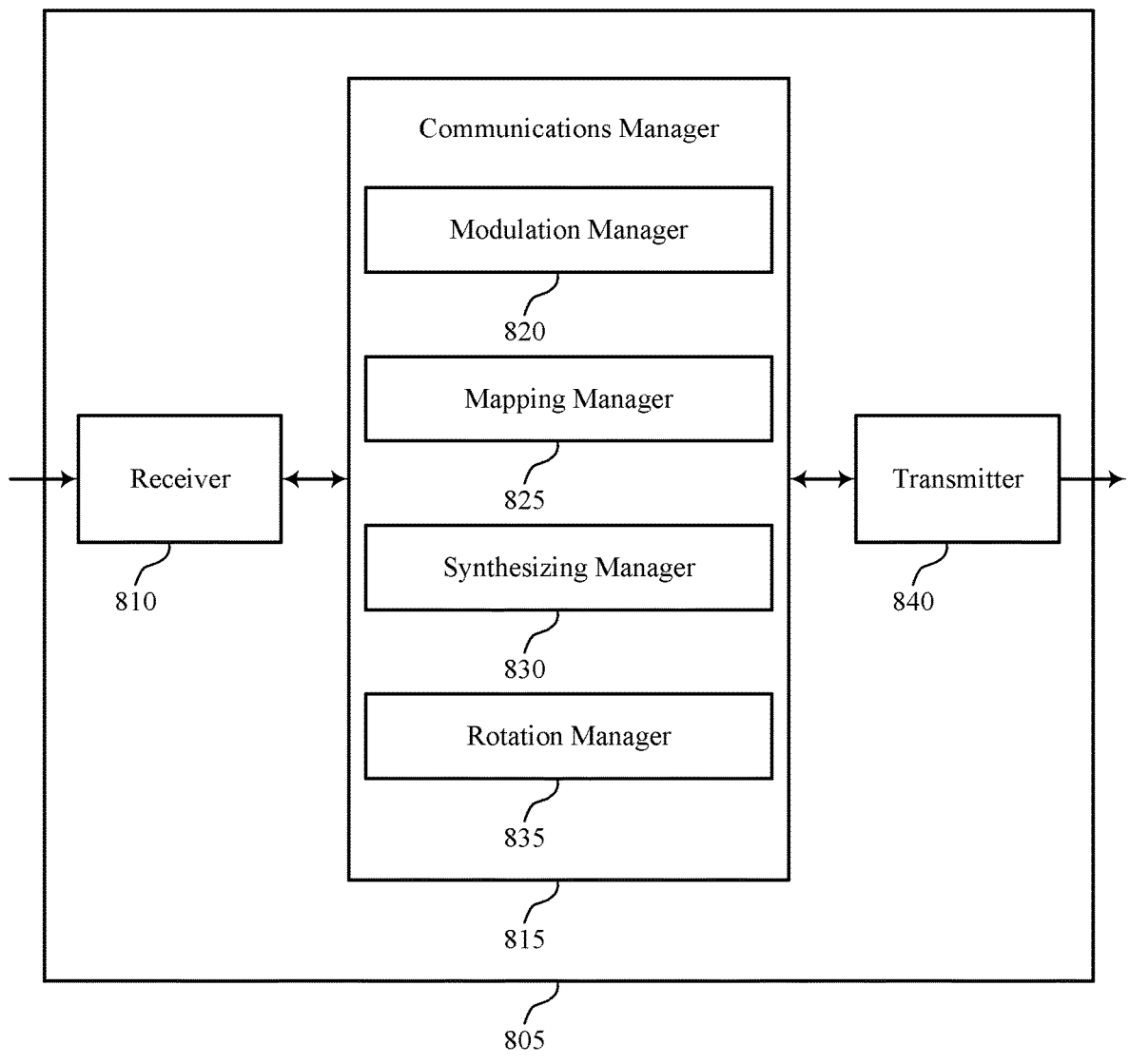

FIG. 8 shows a block diagram 800 of a device 805 that supports a hybrid polar modulator in accordance with aspects of the present disclosure. The device 805 may be an example of aspects of a device 705 or a device 115 as described herein. The device 805 may include a receiver 810, a communications manager 815, and a transmitter 840. The device 805 may also include a processor. Each of these components may be in communication with one another (e.g., via one or more buses).

The receiver 810 may receive information such as packets, user data, or control information associated with various information channels (e.g., control channels, data channels, and information related to a hybrid polar modulator, etc.). Information may be passed on to other components of the device 805. The receiver 810 may be an example of aspects of the transceiver 1020 described with reference to FIG. 10. The receiver 810 may utilize a single antenna or a set of antennas.

The communications manager 815 may be an example of aspects of the communications manager 715 as described herein. The communications manager 815 may include a modulation manager 820, a mapping manager 825, a synthesizing manager 830, and a rotation manager 835. The communications manager 815 may be an example of aspects of the communications manager 1010 described herein. The modulation manager 820 may identify phase information generated from modulation information and generate a modulated signal associated with a carrier frequency based on mapping the phase information and rotating the phase trajectory.

The mapping manager 825 may map the phase information by mapping a second phase point located in a second quadrant to a first phase point of a first quadrant, the first phase point being associated with a phase trajectory of the phase information. The synthesizing manager 830 may synthesize the mapped phase information associated with the phase trajectory based on mapping the phase information. The rotation manager 835 may rotate the phase trajectory based on a phase-plane rotation value associated with mapping the phase information.

The transmitter 840 may transmit signals generated by other components of the device 805. In some examples, the transmitter 840 may be collocated with a receiver 810 in a transceiver module. For example, the transmitter 840 may be an example of aspects of the transceiver 1020 described with reference to FIG. 10. The transmitter 840 may utilize a single antenna or a set of antennas.

In some examples, the communications manager 815 may base decisions, strategies, and/or implementations based at least in part on given objectives regarding phase trajectories associated based at least in part on generated frequency information (e.g., frequency information 345), phase-plane rotation information (e.g., phase-plane rotation information 335), or both. In some cases, the given objectives may include an objective to minimize the generated frequency information. In some cases, to minimize the generated frequency information the mapping manager 825 may communicate and cooperate with the rotation manager 835 and modulation manager 820 in the selection of one or more trajectory choices. In some cases, communications manager 815 may select from two or more trajectory choices (e.g., transition at least a portion of a trajectory that enters quadrant B, C, or D into quadrant A; keep at least a portion of a trajectory that enters quadrant B, C, or D in its original trajectory). In some cases, communications manager 815 may select from two or more trajectory choices based at least in part on generated frequency information, or phase-plane rotation information, or both.

Figure 9:
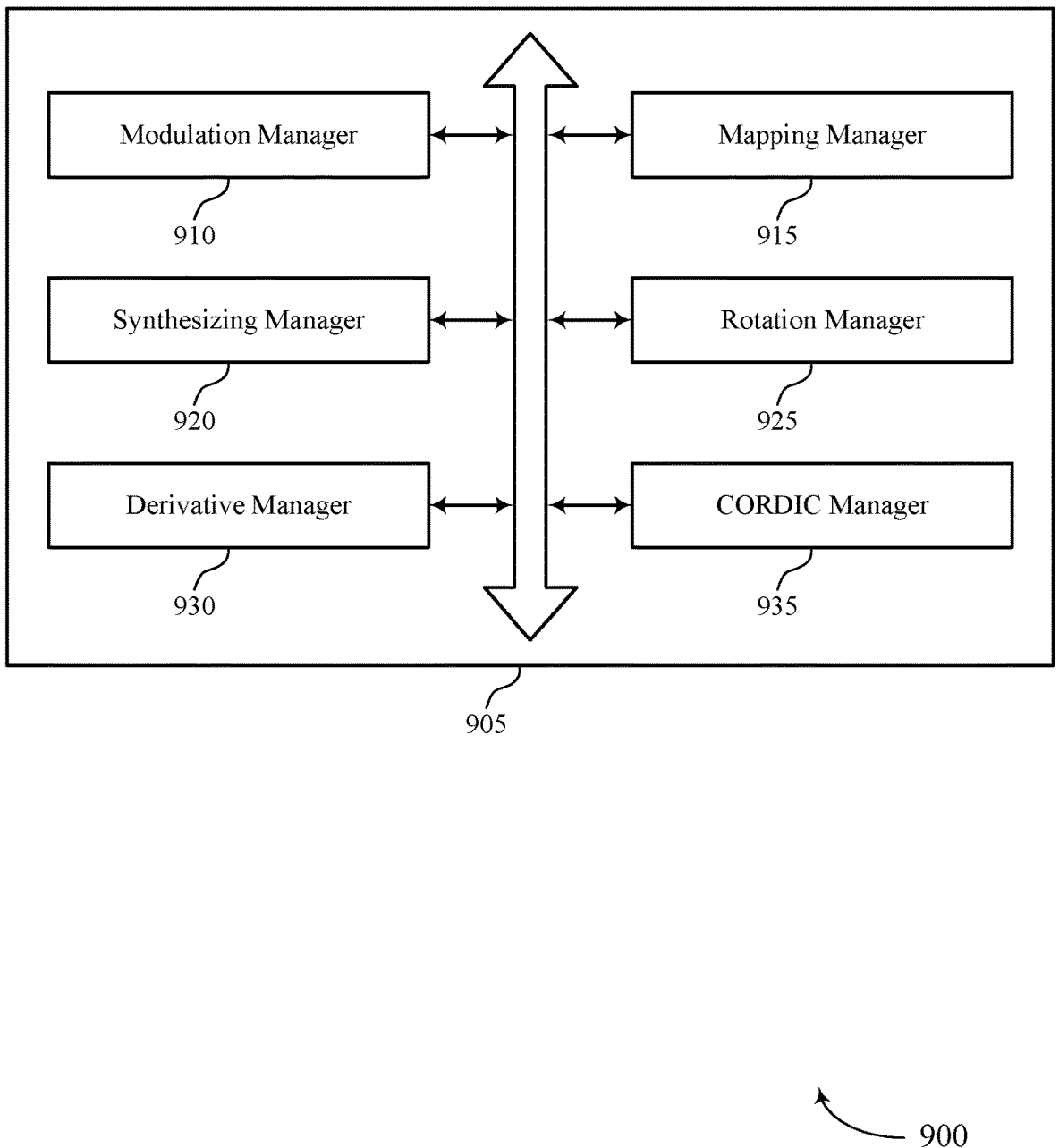
FIG. 9 shows a block diagram of a communications manager that supports a hybrid polar modulator in accordance with aspects of the present disclosure.

FIG. 9 shows a block diagram 900 of a communications manager 905 that supports a hybrid polar modulator in accordance with aspects of the present disclosure. The communications manager 905 may be an example of aspects of a communications manager 715, a communications manager 815, or a communications manager 1010 described herein.

The communications manager 905 may include a modulation manager 910, a mapping manager 915, a synthesizing manager 920, a rotation manager 925, a derivative manager 930, and a CORDIC manager 935. Each of these modules may communicate, directly or indirectly, with one another (e.g., via one or more buses).

The modulation manager 910 may identify phase information generated from modulation information. In some examples, the modulation manager 910 may generate a modulated signal associated with a carrier frequency based on mapping the phase information and rotating the phase trajectory.

In some examples, the modulation manager 910 may modulate, before rotating the phase trajectory, the frequency information to generate a modulated phase information to enable a phase-plane rotator to rotate the modulated phase information. In some examples, the modulation manager 910 may combine the modulated phase information with the amplitude information in a power amplifier after rotating the phase trajectory.

The mapping manager 915 may map the phase information by mapping a second phase point located in a second quadrant to a first phase point of a first quadrant, the first phase point being associated with a phase trajectory of the phase information. In some examples, the mapping manager 915 may determine a mapping correspondence by determining that the second phase point is located in the second quadrant, or a third quadrant, or a fourth quadrant, where mapping the phase information is based on the mapping correspondence.

The synthesizing manager 920 may synthesize the mapped phase information associated with the phase trajectory based on mapping the phase information. The rotation manager 925 may rotate the phase trajectory based on a phase-plane rotation value associated with mapping the phase information. In some examples, the rotation manager 925 may rotate the phase trajectory based on determining that the second phase point is located in the second quadrant, or the third quadrant, or the fourth quadrant.

In some examples, the rotation manager 925 may rotate the phase trajectory: positive 90 degrees when the second phase point is located in the second quadrant, 180 degrees when the second phase point is located in the third quadrant, or negative 90 degrees when the second phase point is located in the fourth quadrant. In some examples, the rotation manager 925 may communicate the modulated phase information through an analog delay line and a multiplexor to modify the modulated phase information. In some examples, the rotation manager 925 may provide the modified modulated phase information to a power amplifier.

The derivative manager 930 may calculate, before rotating the phase trajectory, a derivative of the mapped phase information to generate frequency information to enable a phase locked loop to modulate the frequency information.

The CORDIC manager 935 may generate amplitude information and the phase information based on performing a Coordinate Rotation Digital Computer (CORDIC) algorithm on the modulation information.

Figure 10:
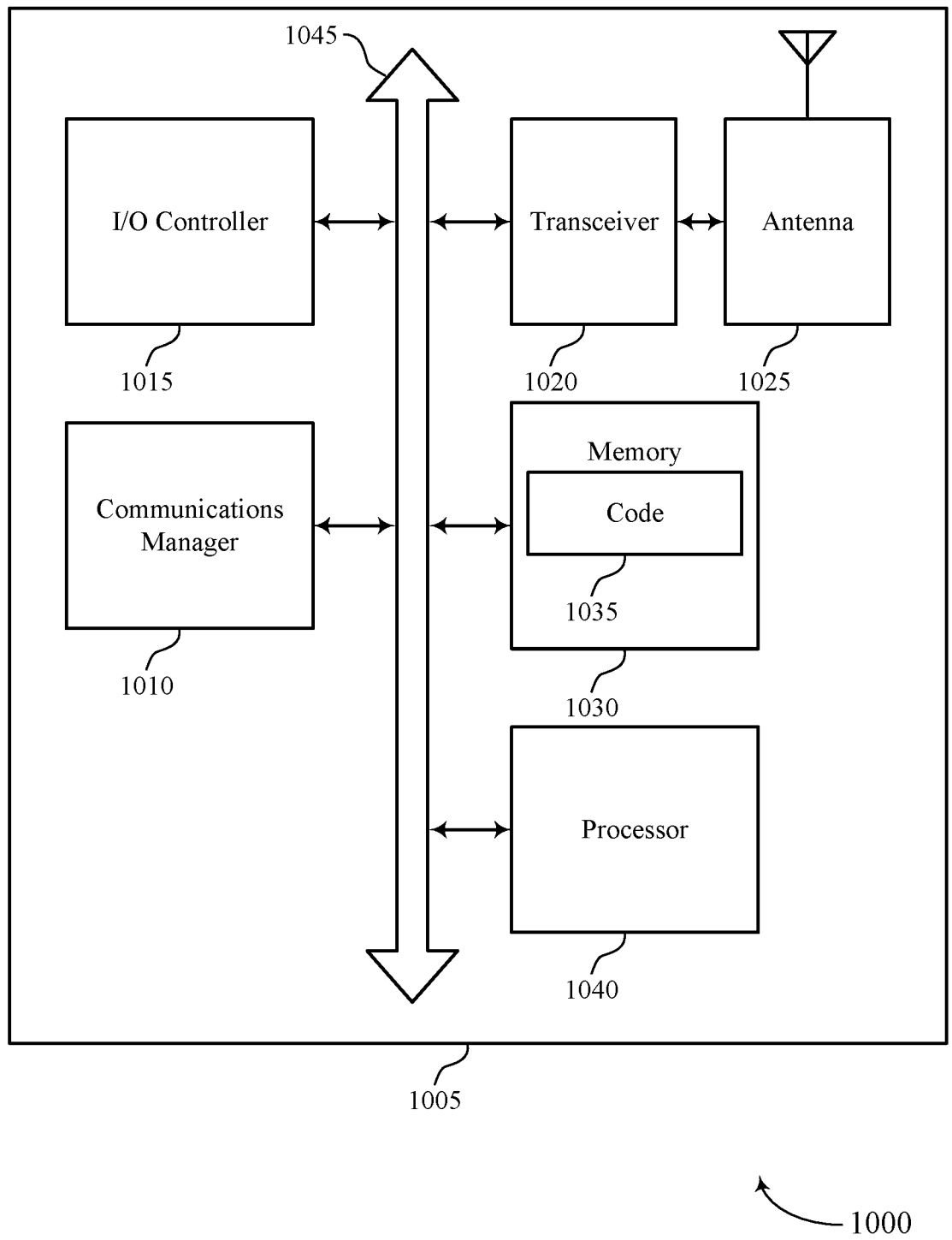
FIG. 10 shows a diagram of a system including a device that supports a hybrid polar modulator in accordance with aspects of the present disclosure.

FIG. 10 shows a diagram of a system 1000 including a device 1005 that supports a hybrid polar modulator in accordance with aspects of the present disclosure. The device 1005 may be an example of or include the components of device 705, device 805, or a device as described herein. The device 1005 may include components for bi-directional voice and data communications including components for transmitting and receiving communications, including a communications manager 1010, an I/O controller 1015, a transceiver 1020, an antenna 1025, memory 1030, and a processor 1040. These components may be in electronic communication via one or more buses (e.g., bus 1045).

The communications manager 1010 may identify phase information generated from modulation information, generate a modulated signal associated with a carrier frequency based on mapping the phase information and rotating the phase trajectory, map the phase information by mapping a second phase point located in a second quadrant to a first phase point of a first quadrant, the first phase point being associated with a phase trajectory of the phase information, synthesize the mapped phase information associated with the phase trajectory based on mapping the phase information, and rotate the phase trajectory based on a phase-plane rotation value associated with mapping the phase information.

The I/O controller 1015 may manage input and output signals for the device 1005. The I/O controller 1015 may also manage peripherals not integrated into the device 1005. In some cases, the I/O controller 1015 may represent a physical connection or port to an external peripheral. In some cases, the I/O controller 1015 may utilize an operating system such as iOS®, ANDROID®, MS-DOS®, MS-WINDOWS®, OS/2®, UNIX®, LINUX®, or another known operating system. In other cases, the I/O controller 1015 may represent or interact with a modem, a keyboard, a mouse, a touchscreen, or a similar device. In some cases, the I/O controller 1015 may be implemented as part of a processor. In some cases, a user may interact with the device 1005 via the I/O controller 1015 or via hardware components controlled by the I/O controller 1015.

The transceiver 1020 may communicate bi-directionally, via one or more antennas, wired, or wireless links as described above. For example, the transceiver 1020 may represent a wireless transceiver and may communicate bi-directionally with another wireless transceiver. The transceiver 1020 may also include a modem to modulate the packets and provide the modulated packets to the antennas for transmission, and to demodulate packets received from the antennas.

In some cases, the wireless device may include a single antenna 1025. However, in some cases the device may have more than one antenna 1025, which may be capable of concurrently transmitting or receiving multiple wireless transmissions.

The memory 1030 may include RAM and ROM. The memory 1030 may store computer-readable, computer-executable code 1035 including instructions that, when executed, cause the processor to perform various functions described herein. In some cases, the memory 1030 may contain, among other things, a BIOS which may control basic hardware or software operation such as the interaction with peripheral components or devices.

The processor 1040 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting a hybrid polar modulator).

The code 1035 may include instructions to implement aspects of the present disclosure, including instructions to support wireless communications. The code 1035 may be stored in a non-transitory computer-readable medium such as system memory or other type of memory. In some cases, the code 1035 may not be directly executable by the processor 1040 but may cause a computer (e.g., when compiled and executed) to perform functions described herein.

Figure 11:
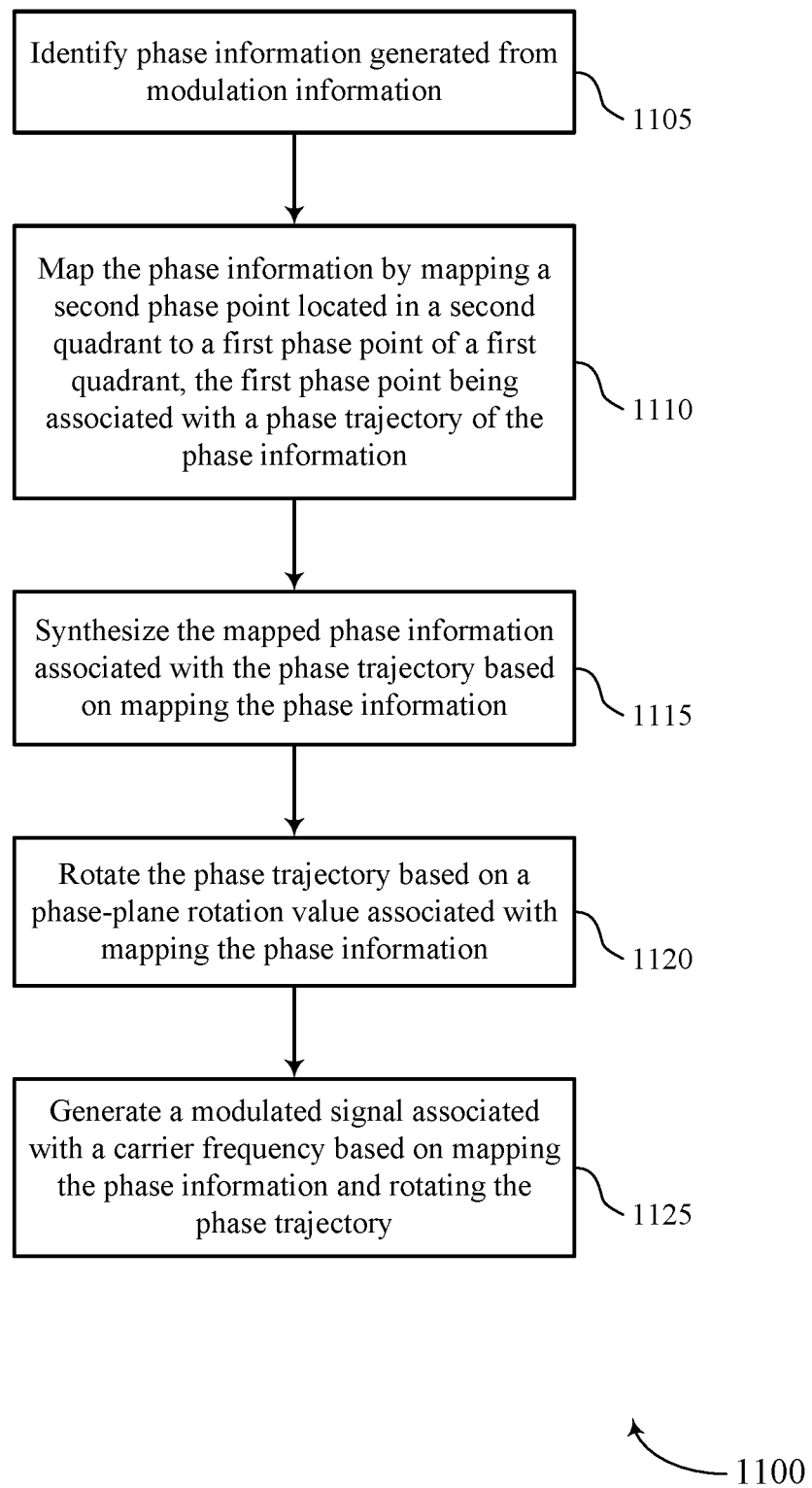
FIGS. 11 and 12 show flowcharts illustrating methods that support a hybrid polar modulator in accordance with aspects of the present disclosure.

FIG. 11 shows a flowchart illustrating a method 1100 that supports a hybrid polar modulator in accordance with aspects of the present disclosure. The operations of method 1100 may be implemented by a device or its components as described herein. For example, the operations of method 1100 may be performed by a communications manager as described with reference to FIGS. 7 through 10. In some examples, a device may execute a set of instructions to control the functional elements of the device to perform the functions described below. Additionally or alternatively, a device may perform aspects of the functions described below using special-purpose hardware.

At 1105, the device may identify phase information generated from modulation information. The operations of 1105 may be performed according to the methods described herein. In some examples, aspects of the operations of 1105 may be performed by a modulation manager as described with reference to FIGS. 7 through 10.

At 1110, the device may map the phase information by mapping a second phase point located in a second quadrant to a first phase point of a first quadrant, the first phase point being associated with a phase trajectory of the phase information. The operations of 1110 may be performed according to the methods described herein. In some examples, aspects of the operations of 1110 may be performed by a mapping manager as described with reference to FIGS. 7 through 10.

At 1115, the device may synthesize the mapped phase information associated with the phase trajectory based on mapping the phase information. The operations of 1115 may be performed according to the methods described herein. In some examples, aspects of the operations of 1115 may be performed by a synthesizing manager as described with reference to FIGS. 7 through 10.

At 1120, the device may rotate the phase trajectory based on a phase-plane rotation value associated with mapping the phase information. The operations of 1120 may be performed according to the methods described herein. In some examples, aspects of the operations of 1120 may be performed by a rotation manager as described with reference to FIGS. 7 through 10.

At 1125, the device may generate a modulated signal associated with a carrier frequency based on mapping the phase information and rotating the phase trajectory. The operations of 1125 may be performed according to the methods described herein. In some examples, aspects of the operations of 1125 may be performed by a modulation manager as described with reference to FIGS. 7 through 10.

Figure 12:
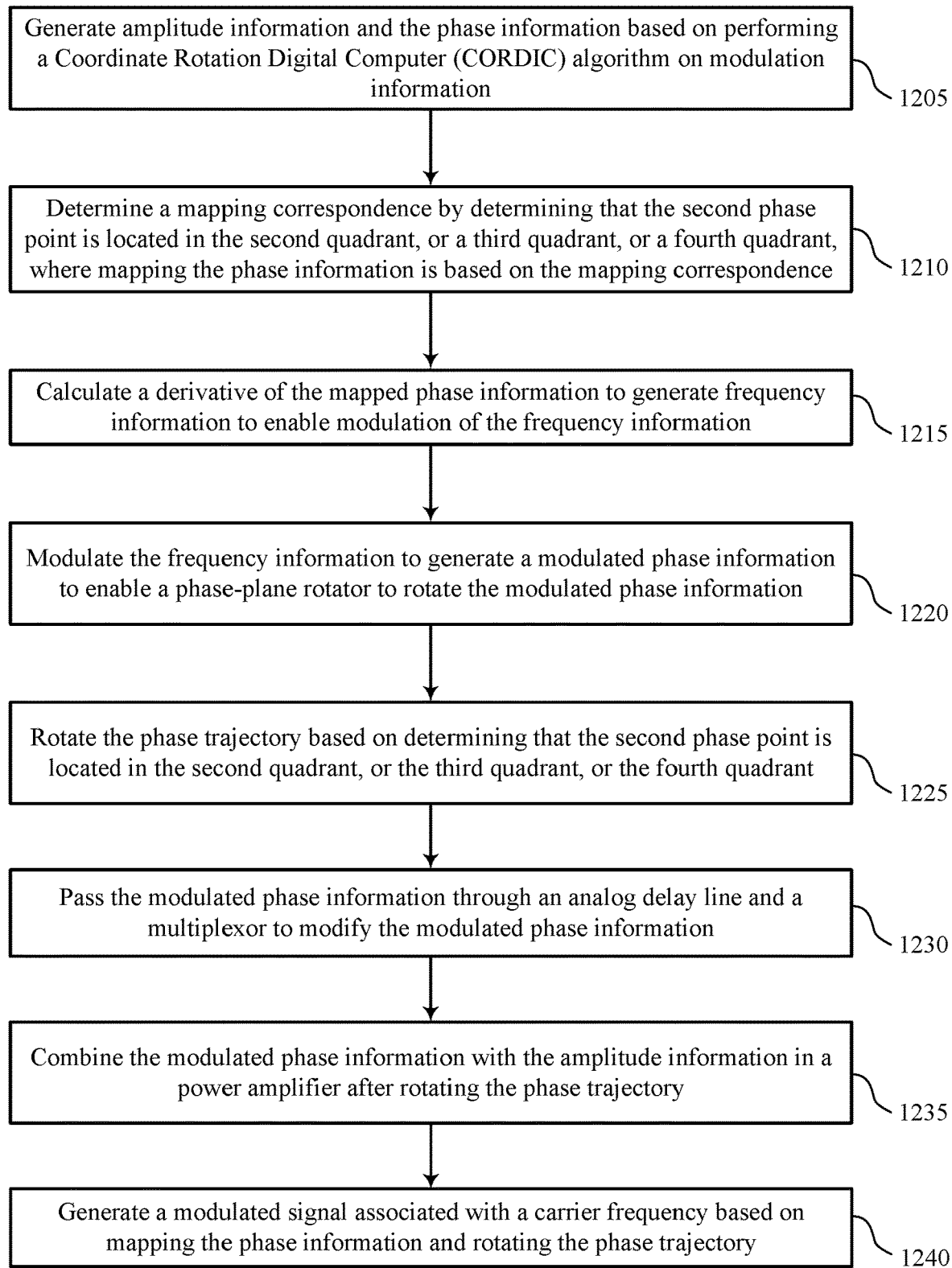

FIG. 12 shows a flowchart illustrating a method 1200 that supports a hybrid polar modulator in accordance with aspects of the present disclosure. The operations of method 1200 may be implemented by a device or its components as described herein. For example, the operations of method 1200 may be performed by a communications manager as described with reference to FIGS. 7 through 10. In some examples, a device may execute a set of instructions to control the functional elements of the device to perform the functions described below. Additionally or alternatively, a device may perform aspects of the functions described below using special-purpose hardware.

At 1205, the device may generate amplitude information and the phase information based on performing a Coordinate Rotation Digital Computer (CORDIC) algorithm on modulation information. The operations of 1205 may be performed according to the methods described herein. In some examples, aspects of the operations of 1205 may be performed by a CORDIC manager as described with reference to FIGS. 7 through 10.

At 1210, the device may determine a mapping correspondence by determining that the second phase point is located in the second quadrant, or a third quadrant, or a fourth quadrant, where mapping the phase information is based on the mapping correspondence. The operations of 1210 may be performed according to the methods described herein. In some examples, aspects of the operations of 1210 may be performed by a mapping manager as described with reference to FIGS. 7 through 10.

At 1215, the device may calculate a derivative of the mapped phase information to generate frequency information to enable a phase locked loop to modulate the frequency information. The operations of 1215 may be performed according to the methods described herein. In some examples, aspects of the operations of 1215 may be performed by a derivative manager as described with reference to FIGS. 7 through 10.

At 1220, the device may modulate the frequency information to generate a modulated phase information to enable a phase-plane rotator to rotate the modulated phase information. The operations of 1220 may be performed according to the methods described herein. In some examples, aspects of the operations of 1220 may be performed by a modulation manager as described with reference to FIGS. 7 through 10.

At 1225, the device may rotate the phase trajectory based on determining that the second phase point is located in the second quadrant, or the third quadrant, or the fourth quadrant. The operations of 1225 may be performed according to the methods described herein. In some examples, aspects of the operations of 1225 may be performed by a rotation manager as described with reference to FIGS. 7 through 10.

At 1230, the device may communicate the modulated phase information through an analog delay line and a multiplexor to modify the modulated phase information. In some cases, rotating the phase trajectory may be based on communicating the modulated phase information through the analog delay line and multiplexor. The operations of 1230 may be performed according to the methods described herein. In some examples, aspects of the operations of 1230 may be performed by a rotation manager as described with reference to FIGS. 7 through 10.

At 1235, the device may combine the modulated phase information with the amplitude information in a power amplifier after rotating the phase trajectory. The operations of 1235 may be performed according to the methods described herein. In some examples, aspects of the operations of 1235 may be performed by a modulation manager as described with reference to FIGS. 7 through 10.

At 1240, the device may generate a modulated signal associated with a carrier frequency based on mapping the phase information and rotating the phase trajectory. The operations of 1240 may be performed according to the methods described herein. In some examples, aspects of the operations of 1240 may be performed by a modulation manager as described with reference to FIGS. 7 through 10.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for hybrid polar modulation at a device, comprising:

identifying phase information generated from modulation information;

mapping the phase information by mapping a second phase point located in a second quadrant to a first phase point of a first quadrant, the first phase point being associated with a phase trajectory of the phase information;

synthesizing the mapped phase information associated with the phase trajectory based at least in part on mapping the phase information, wherein synthesizing the phase information comprises calculating, before rotating the phase trajectory, a derivative of the mapped phase information to generate frequency information to enable a phase locked loop to modulate the frequency information, and modulating, before rotating the phase trajectory, the frequency information to generate a modulated phase information to enable a phase-plane rotator to rotate the modulated phase information;

rotating the phase trajectory based at least in part on a phase-plane rotation value associated with mapping the phase information; and generating a modulated signal associated with a carrier frequency based at least in part on mapping the phase information and rotating the phase trajectory.

2. The method of claim 1, further comprising:

determining a mapping correspondence by determining that the second phase point is located in the second quadrant, or a third quadrant, or a fourth quadrant, wherein mapping the phase information is based at least in part on the mapping correspondence.

3. The method of claim 2, wherein rotating the phase trajectory is based at least in part on determining that the second phase point is located in the second quadrant, or the third quadrant, or the fourth quadrant.

4. The method of claim 2, wherein rotating the phase trajectory further comprises:

rotating the phase trajectory: positive 90 degrees when the second phase point is located in the second quadrant, 180 degrees when the second phase point is located in the third quadrant, or negative 90 degrees when the second phase point is located in the fourth quadrant.

5. The method of claim 1, wherein rotating the phase trajectory comprises:

communicating the modulated phase information through an analog delay line and a multiplexor to modify the modulated phase information; and providing the modified modulated phase information to a power amplifier.

6. The method of claim 1, further comprising:

generating amplitude information and the phase information based at least in part on performing a Coordinate Rotation Digital Computer (CORDIC) algorithm on the modulation information.

7. The method of claim 6, wherein generating the modulated signal comprises:

combining the modulated phase information with the amplitude information in a power amplifier after rotating the phase trajectory.

8. An apparatus for hybrid polar modulation, comprising:
a processor,
memory in electronic communication with the processor; and
instructions stored in the memory and executable by the processor to cause the apparatus to:
identify phase information generated from modulation information;

map the phase information by mapping a second phase point located in a second quadrant to a first phase point of a first quadrant, the first phase point being associated with a phase trajectory of the phase information;

synthesize the mapped phase information associated with the phase trajectory based at least in part on mapping the phase information, wherein the instructions to synthesize the phase information further are executable by the processor to cause the apparatus to: calculate, before rotating the phase trajectory, a derivative of the mapped phase information to generate frequency information to enable a phase locked loop to modulate the frequency information, and modulate, before rotating the phase trajectory, the frequency information to generate a modulated phase information to enable a phase-plane rotator to rotate the modulated phase information;

rotate the phase trajectory based at least in part on a phase-plane rotation value associated with mapping the phase information; and generate a modulated signal associated with a carrier frequency based at least in part on mapping the phase information and rotating the phase trajectory.

9. The apparatus of claim 8, wherein the instructions are further executable by the processor to cause the apparatus to:

determine a mapping correspondence by determining that the second phase point is located in the second quadrant, or a third quadrant, or a fourth quadrant, wherein mapping the phase information is based at least in part on the mapping correspondence.

10. The apparatus of claim 9, wherein rotating the phase trajectory is based at least in part on determining that the second phase point is located in the second quadrant, or the third quadrant, or the fourth quadrant.

11. The apparatus of claim 9, wherein the instructions to rotate the phase trajectory further are executable by the processor to cause the apparatus to:

rotate the phase trajectory: positive 90 degrees when the second phase point is located in the second quadrant, 180 degrees when the second phase point is located in the third quadrant, or negative 90 degrees when the second phase point is located in the fourth quadrant.

12. The apparatus of claim 8, wherein the instructions to rotate the phase trajectory are executable by the processor to cause the apparatus to:

communicate the modulated phase information through an analog delay line and a multiplexor to modify the modulated phase information; and provide the modified modulated phase information to a power amplifier.

13. The apparatus of claim 8, wherein the instructions are further executable by the processor to cause the apparatus to:

generate amplitude information and the phase information based at least in part on performing a Coordinate Rotation Digital Computer (CORDIC) algorithm on the modulation information.

14. The apparatus of claim 13, wherein the instructions to generate the modulated signal are executable by the processor to cause the apparatus to:

combine the modulated phase information with the amplitude information in a power amplifier after rotating the phase trajectory.

15. An apparatus for hybrid polar modulation, comprising:

means for identifying phase information generated from modulation information;

means for mapping the phase information by mapping a second phase point located in a second quadrant to a first phase point of a first quadrant, the first phase point being associated with a phase trajectory of the phase information;

means for synthesizing the mapped phase information associated with the phase trajectory based at least in part on mapping the phase information, wherein the means for synthesizing the phase information comprises means for calculating, before rotating the phase trajectory, a derivative of the mapped phase information to generate frequency information to enable a phase locked loop to modulate the frequency information, and means for modulating, before rotating the phase trajectory, the frequency information to generate a modulated phase information to enable a phase-plane rotator to rotate the modulated phase information;

means for rotating the phase trajectory based at least in part on a phase-plane rotation value associated with mapping the phase information; and means for generating a modulated signal associated with a carrier frequency based at least in part on mapping the phase information and rotating the phase trajectory.

16. The apparatus of claim 15, further comprising:

means for determining a mapping correspondence by determining that the second phase point is located in the second quadrant, or a third quadrant, or a fourth quadrant, wherein mapping the phase information is based at least in part on the mapping correspondence.

* * * * *